United States Patent
Zhang et al.

(10) Patent No.: US 10,476,040 B2
(45) Date of Patent: Nov. 12, 2019

(54) OLED PACKAGING METHOD AND PACKAGING STRUCTURE

(71) Applicant: Wuhan China Star Optoelectronics Semiconductor Display Technology Co., Ltd., Wuhan, Hubei (CN)

(72) Inventors: Ming Zhang, Hubei (CN); Jie Yang, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 16/017,175

(22) Filed: Jun. 25, 2018

(65) Prior Publication Data

US 2019/0237697 A1 Aug. 1, 2019

Related U.S. Application Data

(63) Continuation of application No. PCT/CN2018/078913, filed on Mar. 14, 2018.

(30) Foreign Application Priority Data

Jan. 30, 2018 (CN) .......................... 2018 1 0088649

(51) Int. Cl.
  *H01L 35/24* (2006.01)
  *H01L 51/52* (2006.01)
  *H01L 51/00* (2006.01)
  *H01L 51/56* (2006.01)
  *B05D 7/00* (2006.01)

(52) U.S. Cl.
  CPC ........ *H01L 51/529* (2013.01); *H01L 51/0097* (2013.01); *H01L 51/5253* (2013.01); *H01L 51/56* (2013.01); *B05D 7/50* (2013.01); *H01L 2251/5338* (2013.01); *H01L 2251/5369* (2013.01); *H01L 2251/558* (2013.01)

(58) Field of Classification Search
  CPC combination set(s) only.
  See application file for complete search history.

(56) References Cited

U.S. PATENT DOCUMENTS

2005/0214556 A1  9/2005  Nishimi et al.

FOREIGN PATENT DOCUMENTS

CN  106848088 A  6/2017

*Primary Examiner* — Robert G Bachner
(74) *Attorney, Agent, or Firm* — Leong C. Lei

(57) ABSTRACT

The invention provides an OLED packaging structure and method, wherein the OLED packaging structure comprises: a substrate disposed with OLED device; a first inorganic barrier layer formed on the substrate and covering the OLED device; an organic buffer layer formed on the first inorganic barrier layer, the organic buffer layer being doped with particles having negative thermal expansion coefficient; a second inorganic barrier layer formed on the substrate and covering the first inorganic barrier layer and the organic buffer layer. By doping the organic buffer layer with particles with negative thermal expansion coefficient to form a gradient doping organic buffer layer, the invention can reduce thermal deformation of the organic buffer layer, reduce or even eliminate the thermal expansion and deformation difference at the interface between the organic buffer layer and the inorganic barrier layer, thereby to reduce the film peeling or bubbling probability and improve packaging reliability.

6 Claims, 2 Drawing Sheets

OLED PACKAGING METHOD AND PACKAGING STRUCTURE

CROSS REFERENCE TO RELATED APPLICATIONS

This application is a continuing application of PCT Patent Application No. PCT/CN2018/078913, entitled "OLED PACKAGING METHOD AND PACKAGING STRUCTURE", filed on Mar. 14, 2018, which claims priority to Chinese Patent Application No. CN201810088649.1, filed on Jan. 30, 2018, both of which are hereby incorporated in its entireties by reference.

BACKGROUND OF THE INVENTION

1. Field of the Invention

The present invention relates to the field of display and, in particular, to the field of an OLED packaging method and packaging structure.

2. The Related Arts

As the technology progresses, the demands on the display panel are also higher and higher. The flexible organic light-emitting diode (OLED) becomes popular due to the advantages of wide color gamut, high contrast, wide viewing angle and flexibility.

As the world more and more relies on the mobile phones, the diversity of usage environments, such as, locales and temperature, also increases. Hence, the mobile phone must be subjected to harsher test, for example, in hot and humid environment, low temperature environment as well as high-low temperature cycles, before shipping.

The flexible OLED packaging usually employs a stack structure of inorganic/organic/inorganic, as shown in FIG. 1, which comprises: a first inorganic barrier layer 11', an organic buffer layer 2', and a second inorganic barrier layer 12', all stacked in order, with each layer having a thickness of micrometer scale, which is relatively thick. The inorganic barrier layer is for insulation from the water and oxygen, with thickness of 1 mm. The organic buffer layer is for particle wrapping, planarization and stress relief, with thickness of 10 mm thicker than the inorganic layer in general. The organic and the inorganic layers provide different functions to guarantee the reliability of the packaging. However, because of the difference in the properties of organic and inorganic materials, many issues must be addressed.

Because the inorganic barrier layer is usually made of SiNx, SiON, or Al2O3, the thermal expansion coefficient is small. The organic buffer layer is usually made of acrylic, epoxy, decane and other organic materials with a large thermal expansion coefficient, which is several times or even 10 times that of inorganic materials. With such large thermal performance differences, a large difference in the thermal deformation between the organic layer and the inorganic layer is prone to occur in the test environment, which would lead to peeling of the film layer or the generation of bubble 20', and result in poor yield rate, as shown in FIG. 2.

SUMMARY OF THE INVENTION

The primary object of the present invention is to provide an OLED packaging method and packaging structure, able to improve packaging reliability.

To solve the above technical issue, the present invention provides an OLED packaging structure, which comprises:
a substrate disposed with OLED device;
a first inorganic barrier layer formed on the substrate and covering the OLED device;
an organic buffer layer formed on the first inorganic barrier layer, the organic buffer layer being doped with particles having negative thermal expansion coefficient; and
a second inorganic barrier layer formed on the substrate and covering the first inorganic barrier layer and the organic buffer layer.

According to a preferred embodiment of the present invention, the particles having negative thermal expansion coefficient doped to the organic buffer layer have a volume ratio gradually increases in a gradient order from center of the organic buffer layer respectively towards the first inorganic barrier layer and the second inorganic barrier layer.

According to a preferred embodiment of the present invention, the volume ratio increases in a gradient of 0%-50% from center of the organic buffer layer respectively towards the first inorganic barrier layer and the second inorganic barrier layer.

According to a preferred embodiment of the present invention, the first inorganic barrier layer and the second inorganic barrier layer are both single-layer structured or stack-structured, or one is single-layer structured and the other is stack-structured.

According to a preferred embodiment of the present invention, the particles having negative thermal expansion coefficient are made of one of the following materials: perovskite, strontium, tungstate, and molybdate.

According to a preferred embodiment of the present invention, the first inorganic barrier layer and the second inorganic barrier layer have a thickness of 0.1-2 mm, and the organic buffer layer has a thickness of 4-20 mm.

The present invention also provides an OLED packaging method, which comprises the following steps of:
providing a substrate disposed with OLED device;
forming a first inorganic barrier layer on the substrate covering the OLED device;
doping an organic material with particles having negative thermal coefficient, depositing on the first inorganic barrier layer to form an organic buffer layer;
forming a second inorganic barrier layer on the substrate covering the organic buffer layer and the first inorganic barrier layer.

According to a preferred embodiment of the present invention, the particles having negative thermal expansion coefficient doped to the organic buffer layer have a volume ratio gradually increases in a gradient order from center of the organic buffer layer respectively towards the first inorganic barrier layer and the second inorganic barrier layer.

According to a preferred embodiment of the present invention, the volume ratio increases in a gradient of 0%-50% from center of the organic buffer layer respectively towards the first inorganic barrier layer and the second inorganic barrier layer.

According to a preferred embodiment of the present invention, the step of doping an organic material with particles having negative thermal coefficient, depositing on the first inorganic barrier layer to form an organic buffer layer specifically comprises:
using mechanical stirring and ultrasonication to uniformly mix the particles having a negative thermal expansion coefficient in the organic material, and then using ink jet printing or spin coating to form a film on the first inorganic barrier layer.

The embodiments of the present invention provide the following advantages: by doping the organic material with particles having a negative expansion coefficient to form a gradient doped organic buffer layer, the thermal deformation of the organic buffer layer of the packaging structure can be reduced, and the thermal expansion and deformation difference at the interface between the organic buffer layer and the inorganic barrier layer can be reduced or even eliminated, thereby to reduce the film peeling or bubbling probability and improve packaging reliability.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort.

DETAILED DESCRIPTION OF THE PREFERRED EMBODIMENTS

To further explain the technical means and effect of the present invention, the following refers to embodiments and drawings for detailed description. Apparently, the described embodiments are merely some embodiments of the present invention, instead of all embodiments. All other embodiments based on embodiments in the present invention and obtained by those skilled in the art without departing from the creative work of the present invention are within the scope of the present invention.

The terms "comprising" and "having" and any variations thereof appearing in the specification, claims, and drawings of the present application are intended to cover non-exclusive inclusion. For example, a process, method, system, product, or device that includes a series of steps or units is not limited to the listed steps or units, but optionally also includes steps or units not listed, or alternatively, other steps or units inherent to these processes, methods, products or equipment. In addition, the terms "first", "second" and "third" are used to distinguish different objects and not intended to describe a particular order.

Figure 1:
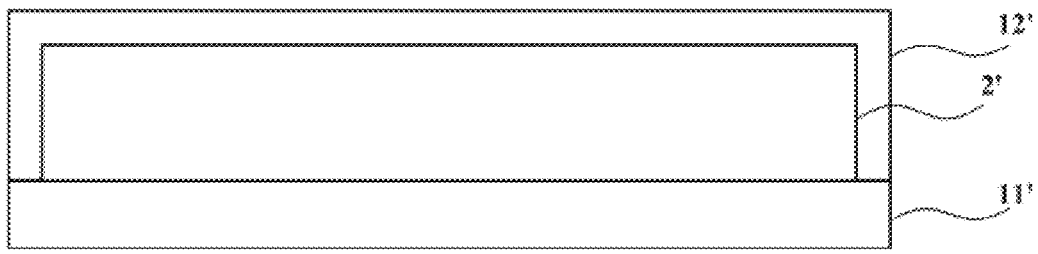
FIG. 1 is a schematic view showing the known OLED packaging structure.
Figure 2:
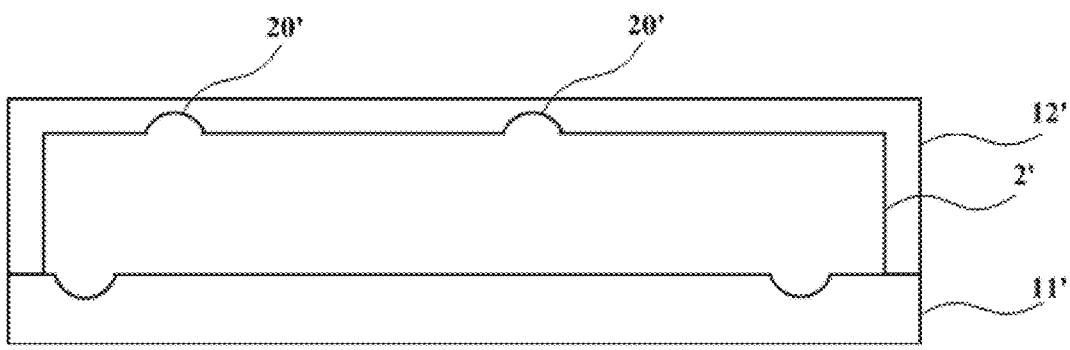
FIG. 2 is a schematic view showing the bubbling at the interface between the organic layer and the inorganic layer in the known OLED packaging structure.
Figure 3:
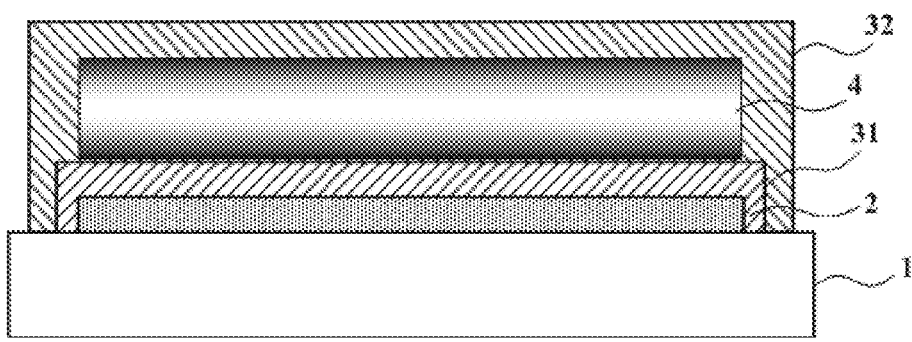
FIG. 3 is a s schematic view showing the OLED packaging structure according to the first embodiment of the present invention.

Refer to FIG. 3. FIG. 3 shows a schematic view of the OLED packaging structure of the first embodiment of the present invention, which comprises:

a substrate 1 disposed with OLED device 2;

a first inorganic barrier layer 31 formed on the substrate 1 and covering the OLED device 2;

an organic buffer layer 4 formed on the first inorganic barrier layer 31, the organic buffer layer 4 being doped with particles having negative thermal expansion coefficient; and a second inorganic barrier layer 32 formed on the substrate 1 and covering the first inorganic barrier layer 31 and the organic buffer layer 4.

As aforementioned, the difference between the thermal expansion coefficients of the organic buffer layer and the inorganic barrier layer is large, and doping is a simple and effective method to change the material properties. In the embodiment of the present invention, the particles having a negative thermal expansion coefficient is doped into the organic buffer layer. When heated, the particles having a negative thermal expansion coefficient will shrink in total volume due to the phase change/rotation coupling, which leads to reducing or even eliminating the thermal expansion deformation difference at the interface between the organic buffer layer and the inorganic barrier layer and resulting in reducing the film peeling and bubbling probability to improve packaging reliability.

Specifically, to guarantee the film continuity and uniformity of the organic buffer layer 4, the particles having negative thermal expansion coefficient doped to the organic buffer layer 4 have a volume ratio gradually increases in a gradient order from center of the organic buffer layer 4 respectively towards the first inorganic barrier layer 31 and the second inorganic barrier layer 32. For example, the volume ratio increases in a gradient of 0%-50% from center of the organic buffer layer 4 respectively towards the first inorganic barrier layer 31 and the second inorganic barrier layer 32. In other words, the center of the organic buffer layer 4 is not doped with particles having a negative thermal expansion coefficient and the organic buffer layer 4 has a negative thermal expansion coefficient of 50% by volume doping at the interface with the first inorganic barrier layer 31 and the second inorganic barrier layer 32, respectively. The volume of the particles with a negative thermal expansion coefficient, between the center of the organic buffer layer 4 and the interface with the first inorganic barrier layer 31 and the second inorganic barrier layer 32, increases in the volume ratio in a gradient manner. It can be understood that, in this embodiment, the center of the organic buffer layer 4 refers to a plane that is located at the center of the organic buffer layer 4 in the longitudinal direction and is parallel to the substrate 1. The volume ratio of the particles with a negative thermal expansion coefficient doped in the organic buffer layer 4 increases from the center of the organic buffer layer 4 to the interface with the first inorganic barrier layer 31 and the second inorganic barrier layer 32 in a gradient manner, which means that the particles with a negative thermal expansion coefficient doped in the organic buffer layer 4 are symmetrically distributed in the plane.

The size of the particles with a negative thermal expansion coefficient doped in the organic buffer layer 4 is of a nanometer scale, the thermal coefficient is negative (volume decreases as the temperature increases), has stable chemical properties, does not react with the ingredients in the air, has a light transmittance, does not change physical or chemical properties after absorbing water, for example, perovskite, strontium, tungstate, and molybdate.

The first inorganic barrier layer 31 and the second inorganic barrier layer 32 have a thickness of 0.1-2 mm, and the material is not limited to the commonly used inorganic barrier material, such as, SiNx, SiOx, Al2O3, and so on. The first inorganic barrier layer 31 and the second inorganic barrier layer 32 are both single-layer structured or stack-structured, or one is single-layer structured and the other is stack-structured. For example, the stack structure can be a SiOx-SiNx stack structure, wherein the first inorganic barrier layer 31 must be able to completely cover the edges of the cathode of the OLED device 2, and the size of the second inorganic barrier layer 32 must not be less than the first inorganic barrier layer 31.

The organic buffer layer 4 doped with particles with a negative thermal expansion coefficient has a thickness of 4-20 mm. The main material is a flexible packaging material, not limited to common organic materials, such as, decane, acrylic, epoxy, and so on, and the particles having a negative thermal expansion coefficient are uniformly mixed in the organic material by mechanical stirring and ultrasonication, and then a film is formed on the first inorganic barrier layer 31 by means of ink-jet printing (IJP), spin coating, and so on.

Figure 4:
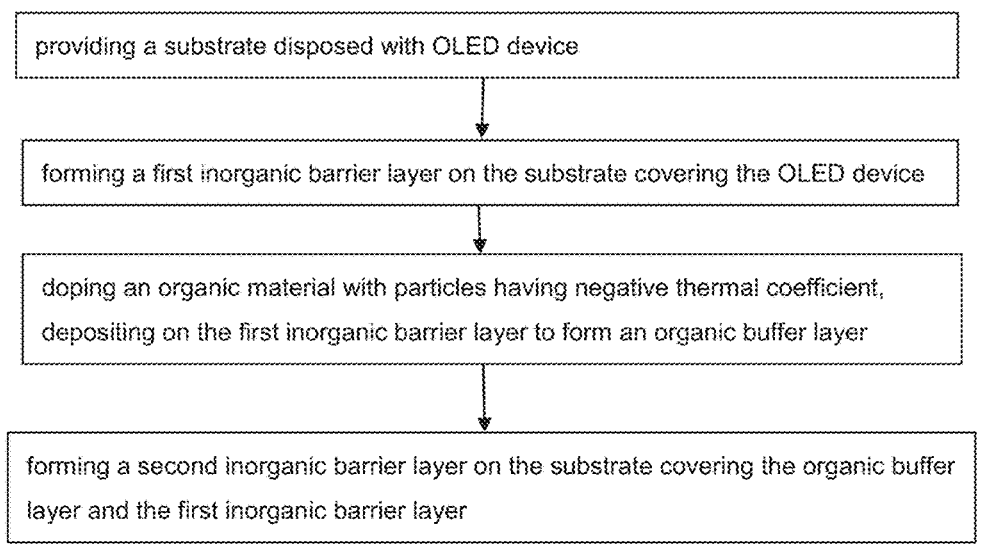
FIG. 4 is a s schematic view showing a flowchart of the OLED packaging method according to the second embodiment of the present invention.

As shown in FIG. 4, with respect to the OLED packaging structure of the present invention, the present invention also provides an OLED packaging method, comprising the following steps of:

providing a substrate disposed with OLED device;

forming a first inorganic barrier layer on the substrate covering the OLED device;

doping an organic material with particles having negative thermal expansion coefficient, depositing on the first inorganic barrier layer to form an organic buffer layer;

forming a second inorganic barrier layer on the substrate covering the organic buffer layer and the first inorganic barrier layer.

Figure 5:
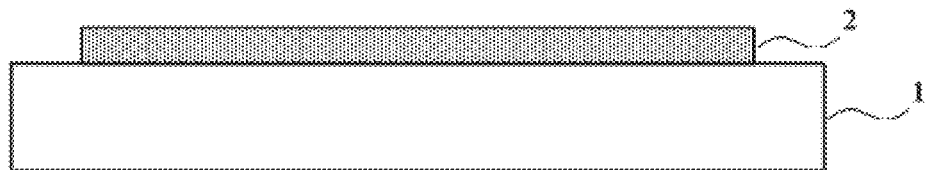
FIGS. 5-7 are schematic views showing the specific steps of OLED packaging method according to the embodiment of the present invention.
Figure 6:
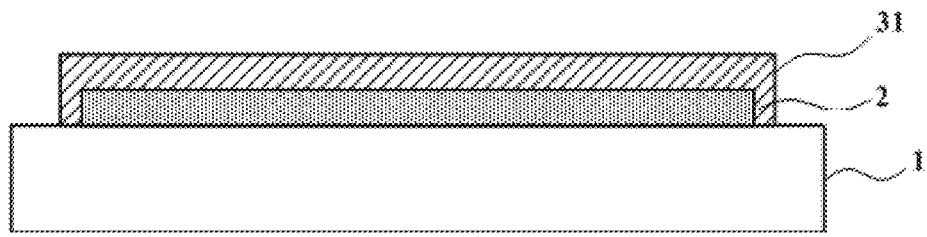
Figure 7:
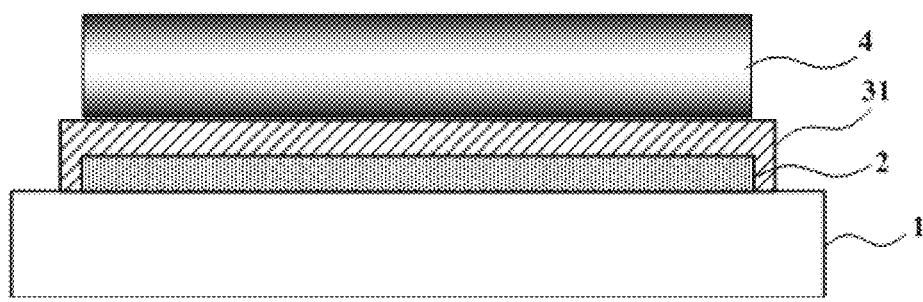

Specifically, refer to FIGS. 5-7, which show schematic views of the specific steps of the OLED packaging method of the present invention. As shown in FIG. 5, providing a substrate 1 disposed with OLED device 2; as shown in FIG. 6, forming a first inorganic barrier layer 31 on the substrate 1 covering the OLED device 2; the first inorganic barrier layer 31 having a thickness of 0.1-2 mm, and the material not limited to the commonly used inorganic barrier material, such as, SiNx, SiOx, Al2O3, and so on, and having a size able to completely cover the edges of the cathode of the OLED device 2. Then, as shown in FIG. 7, using mechanical stirring and ultrasonication to uniformly mix particles having a negative thermal expansion coefficient into in the organic material, wherein to guarantee the film continuity and uniformity, the doping particles have a volume ratio gradually increases in a gradient order, in other words, gradually increases from center of the organic buffer layer respectively towards the first inorganic barrier layer and the second inorganic barrier layer. Moreover, the volume ratio increases in a gradient of 0%-50% from center of the organic buffer layer respectively towards the first inorganic barrier layer and the second inorganic barrier layer. Then, an ink-jet printing (IJP) or spin coating process is used to form a film on the first inorganic barrier layer 31 to form an organic buffer layer with gradient doping of thickness 4-20 mm. The main material is a flexible packaging material, not limited to common organic materials, such as, decane, acrylic, epoxy, and so on. The size of the particles to be doped is of a nanometer scale, the thermal coefficient is negative (volume decreases as the temperature increases), has stable chemical properties, does not react with the ingredients in the air, has a light transmittance, does not change physical or chemical properties after absorbing water, for example, perovskite, strontium, tungstate, and molybdate. Then, as shown in FIG. 3, forming a second inorganic barrier layer on the substrate covering the organic buffer layer and the first inorganic barrier layer. Similar to the first inorganic barrier layer, the second inorganic barrier layer has a thickness of 0.1-2 mm, and the material is not limited to the commonly used inorganic barrier material, such as, SiNx, SiOx, Al2O3, and so on, and the size of the second inorganic barrier layer must not be less than the first inorganic barrier layer. It should be noted that the first inorganic barrier layer and the second inorganic barrier layer are both single-layer structured or stack-structured, or one is single-layer structured and the other is stack-structured. For example, the stack structure can be a SiOx-SiNx stack structure.

In summary, the embodiments of the present invention provide the following advantages: by doping the organic material with particles having a negative expansion coefficient to form a gradient doped organic buffer layer, the thermal deformation of the organic buffer layer of the packaging structure can be reduced, and the thermal expansion and deformation difference at the interface between the organic buffer layer and the inorganic barrier layer can be reduced or even eliminated, thereby to reduce the film peeling or bubbling probability and improve packaging reliability.

It should be noted that each of the embodiments in this specification is described in a progressive manner, each of which is primarily described in connection with other embodiments with emphasis on the difference parts, and the same or similar parts may be seen from each other. For the device embodiment, since it is substantially similar to the method embodiment, the description is relatively simple and the relevant description may be described in part of the method embodiment.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An organic light-emitting diode (OLED) packaging structure, comprising:
    a substrate disposed with OLED device;
    a first inorganic barrier layer formed on the substrate and covering the OLED device;
    an organic buffer layer formed on the first inorganic barrier layer, the organic buffer layer being doped with particles having negative thermal expansion coefficient; and
    a second inorganic barrier layer formed on the substrate and covering the first inorganic barrier layer and the organic buffer layer.

2. The OLED packaging structure as claimed in claim 1, wherein the particles having negative thermal expansion coefficient doped to the organic buffer layer have a volume ratio gradually increases in a gradient order from center of the organic buffer layer respectively towards the first inorganic barrier layer and the second inorganic barrier layer.

3. The OLED packaging structure as claimed in claim 2, wherein the volume ratio increases in a gradient of 0%-50% from center of the organic buffer layer respectively towards the first inorganic barrier layer and the second inorganic barrier layer.

4. The OLED packaging structure as claimed in claim 1, wherein the first inorganic barrier layer and the second inorganic barrier layer are both single-layer structured or stack-structured, or one is single-layer structured and the other is stack-structured.

5. The OLED packaging structure as claimed in claim 1, wherein the particles having negative thermal expansion coefficient are made of one of the following materials: perovskite, strontium, tungstate, and molybdate.

6. The OLED packaging structure as claimed in claim 1, wherein the first inorganic barrier layer and the second inorganic barrier layer have a thickness of 0.1-2 mm, and the organic buffer layer has a thickness of 4-20 mm.

* * * * *